United States Patent [19]
Ortiz

[11] Patent Number: 5,736,881
[45] Date of Patent: Apr. 7, 1998

[54] DIODE DRIVE CURRENT SOURCE

[75] Inventor: Joe A. Ortiz, Garden Grove, Calif.

[73] Assignee: Hughes Electronics, Los Angeles, Calif.

[21] Appl. No.: 662,399

[22] Filed: Jun. 12, 1996

Related U.S. Application Data

[63] Continuation of Ser. No. 349,572, Dec. 5, 1994, abandoned.

[51] Int. Cl.$^6$ ............................................. H03K 3/017
[52] U.S. Cl. ........................... 327/175; 327/515; 327/530; 372/25; 323/269
[58] Field of Search .................................. 327/172, 175, 327/514, 515, 530; 372/25, 38; 323/269

[56] References Cited

U.S. PATENT DOCUMENTS

| | | | |
|---|---|---|---|
| 4,114,051 | 9/1978 | Curtice | 307/260 |
| 4,161,023 | 7/1979 | Goffeau | 363/124 |
| 4,323,845 | 4/1982 | Leach | 323/224 |
| 4,673,865 | 6/1987 | DeLuca et al. | 323/222 |
| 4,720,668 | 1/1988 | Lee et al. | 323/271 |
| 4,723,312 | 2/1988 | Yamashita et al. | 455/613 |
| 4,745,610 | 5/1988 | Yoshikawa | 372/38 |
| 4,751,524 | 6/1988 | Balchunas | 346/108 |
| 4,807,239 | 2/1989 | Takano et al. | 372/25 |
| 5,140,175 | 8/1992 | Yagi et al. | 307/270 |
| 5,182,756 | 1/1993 | Waki et al. | 372/38 |
| 5,287,372 | 2/1994 | Ortiz | 372/25 |
| 5,291,505 | 3/1994 | Nielson | 372/25 |
| 5,315,606 | 5/1994 | Tanaka | 372/38 |
| 5,349,595 | 9/1994 | Ogawa et al. | 372/38 |
| 5,491,491 | 2/1996 | Lebby et al. | 345/7 |

FOREIGN PATENT DOCUMENTS

| | | |
|---|---|---|
| A-0553867 | 4/1993 | European Pat. Off. . |
| A-0567280 | 10/1993 | European Pat. Off. . |
| A-0597644 | 5/1994 | European Pat. Off. . |
| A-1543722 | 4/1979 | United Kingdom . |

OTHER PUBLICATIONS

"GaAs MESFET Laser-Driver for 1.7 Gbit/s Lightwave Transmitter", F. S. Chen et al., Journal of Lightwave Technology, vol. 6, No. 3, March 1988.

*Primary Examiner*—Timothy P. Callahan
*Assistant Examiner*—Jung Ho Kim
*Attorney, Agent, or Firm*—Gordon R. Lindeen III; Michael W. Sales; Wanda K. Denson-Low

[57] ABSTRACT

A current source that uses a regulated constant current power source to supply current to drive a load, and the load current is controlled by shunt switches. If a plurality of loads utilize less than 50% duty factor, then one current source can drive N multiple dissimilar impedance loads, each at 100%/N duty factor. The current source includes a power converter coupled between the power source and the load(s) for providing pulsed current thereto. A current sensor is provided for sensing current flowing through the loads. A controller is coupled between the sensor and the power converter for regulating the amplitude of the output current supplied to the loads. A shunt switch is coupled across the loads, and a duty factor controller is coupled to the shunt switch for setting the duty factor of the shunt switch. A laser drive circuit, or driving light emitting diode arrays is also disclosed that include a plurality of the current sources. Alternatively, if the duty factor is sufficiently low, one current source may be used to drive a plurality of arrays.

13 Claims, 4 Drawing Sheets

DIODE DRIVE CURRENT SOURCE

This is a continuation application Ser. No. 08/349,572 filed Dec. 5, 1994 abandoned.

BACKGROUND

The present invention relates to current sources, and more particularly, to a diode drive current source for use with diode pumped lasers, and the like.

Diode pumping has become the technique of choice for use as pump sources employed in solid-state laser systems due to their relatively high electrical-to-optical efficiency. Prior to the use of diode pumping, flashlamps were used as pump sources. Typical system efficiencies were in the 1% to 2% range. The low efficiency was due mainly to the low electrical-to-optical efficiency. The use of diode pumping, with its higher electrical-to-optical efficiency, can result in a laser system efficiency of 10%, to 15%. Thus, a tenfold reduction in required input power can be achieved.

Diode pumping requires high power, pulsed, regulated current sources to drive the pump diodes. Conventional current sources utilize either a series dissipative regulator or a pulse-width-modulated (PWM) converter to control output current. When used at high output currents, as is required by diode pumped lasers, for example, both of these techniques suffer from high power losses, and are very inefficient.

The series dissipative regulator dissipates the power dropped across a series pass transistor element, where the power is given by P=(Vin−Vout)*Iout. At high output currents, this power loss becomes very high. The PWM converter suffers from high switching losses in a switch transistor, particularly due to reverse recovery of a catch diode, and from switching losses in the catch diode. At high output currents, the reverse recovery currents become very large, and the resulting power losses become very high.

The assignee of the present invention has previously developed a quasi-resonant diode drive current source that is disclosed in U.S. Pat. No. 5,287,372, entitled "Quasi-Resonant Diode Drive Current Source" that overcomes many of the problems associated with conventional diode drive current sources. However such quasi-resonant diode drive current sources have comparatively long (10 μsec) rise and fall times. In addition, the quasi-resonant diode drive current source can drive only one load.

Therefore, it is an objective of the present invention to provide for an improved diode drive current source. It is a further objective of the present invention to provide for a diode drive current source for use with diode pumped lasers. It is a further objective of the present invention to provide for a diode drive current source that is capable of driving a plurality of loads.

SUMMARY OF THE INVENTION

Diode pumping is currently used in solid-state laser systems because it provides higher electrical-to-optical efficiency. The present invention is a critical development in the field of solid-state diode pumped lasers, which require a high current, regulated, current source. Without an efficient power source, diode pumped lasers would not be practical.

In order to meet the above and other objectives, the present invention is a diode drive current source that uses a regulated constant current power source to supply current. The load current is then controlled by shunt switches. If loads utilize less than 50% duty factor, then one diode drive current source can drive N multiple dissimilar impedance loads, each at 100%/N duty factor. Alternately, each load may utilize a different duty factor, provided that the summation of duty factors is less than or equal to 100%.

More specifically, the present invention provides for a current source for driving a load that includes a power source and a power converter coupled between the power source and the load for providing pulsed current to the load. A sensor is provided for sensing current flowing through the load. A controller is coupled between the sensor and the power converter for regulating the amplitude of the pulsed current supplied to the load. A shunt switch is coupled across the load, and a duty factor controller is coupled to the shunt switch for setting the duty factor of the shunt switch.

The present invention also provides for a laser drive circuit for driving light emitting diode arrays that includes a power source, charge storage means coupled to the power source for storing charge, and a plurality of light emitting diode arrays that each contain individual pluralities of light emitting diodes coupled to the charge storage means. A plurality of diode drive circuits are respectively coupled to the plurality of light emitting diode arrays. Alternatively, if the duty factor is low enough, one diode driver can drive all diode arrays. Each of the diode drive circuits comprises the shunt switch coupled across the respective light emitting diodes, and the duty factor controller is coupled to the shunt switch for setting its duty factor.

The use of a quasi-resonant converter as a current source, such as the one described in U.S. Pat. No. 5,287,372, provides relatively high conversion efficiency. This higher efficiency results in less input power drawn from the power source, cooler operation, and therefore higher reliability. This improved efficiency is of great benefit at high output current levels because it represents a very large savings in dissipated power.

However, the present diode drive current source provides much faster output pulse rise and fall times compared to conventional current sources, including the source disclosed in U.S. Pat. No. 5,287,372, which further improves efficiency. In addition, one of the present diode drive sources can drive N multiple dissimilar impedance loads, each at 100%/N duty factor. This provides a significant reduction in size and weight, with improved reliability.

The present invention may be employed with high power solid-state diode pumped lasers such as airborne and ground based laser systems, materials processing lasers, earth observation sensors, undersea surveillance (coastal mine detection and ASW), infrared countermeasures and others.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
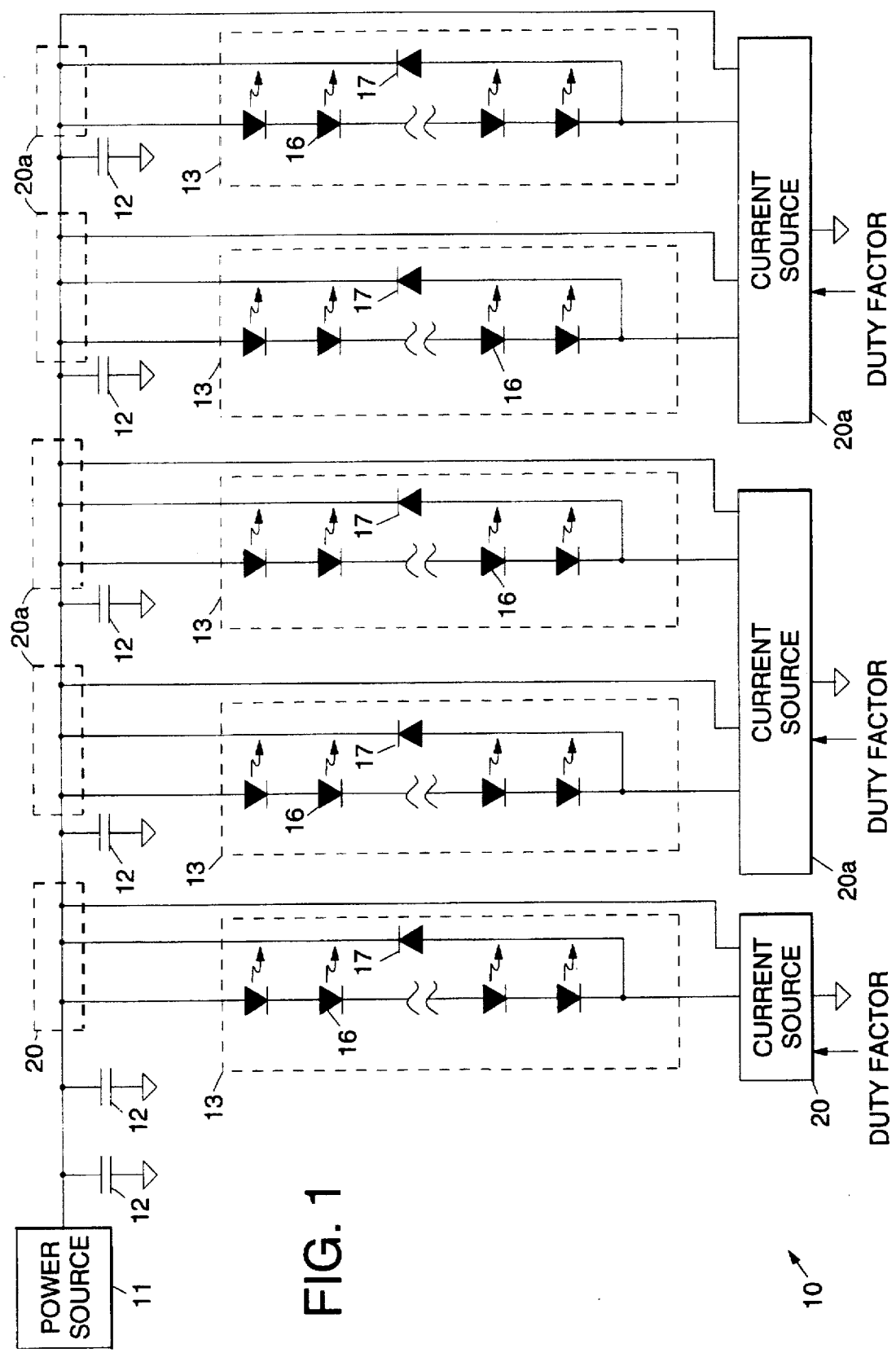
FIG. 1 illustrates a block diagram of a laser diode drive circuit that employs quasi-resonant diode drive current sources of the present invention.

Referring to the drawing figures, FIG. 1 illustrates a block diagram of a laser diode drive circuit 10 that employs a current source 20 that includes diode drive current sources 20a in accordance with the present invention to drive one or a plurality of loads 13, such as laser diode arrays 13 that have varying numbers of light emitting diodes 16 therein. Each of the individual laser diode arrays 13 are adapted to pump laser crystals (not shown) that are part of two amplifiers and an oscillator (not shown). Each of the individual laser diode arrays 13 contains separate pluralities of laser diodes 16 that are coupled in series between a power source 11 and one of the diode drive current sources 20, 20a. A protection diode 17 is coupled around each of the pluralities of light emitting diodes 13 and is used to protect the plurality of light emitting diodes 16 in case of a reverse voltage situation. Capacitive isolation is provided between respective ones of the pluralities of laser diodes current sources 20, 20a using charge storage means 12 such as capacitors 12. The capacitors 12 are used to store charge that is eventually controlled by the diode drive current sources 20, 20a to energize the laser diode arrays 13.

Figure 2:
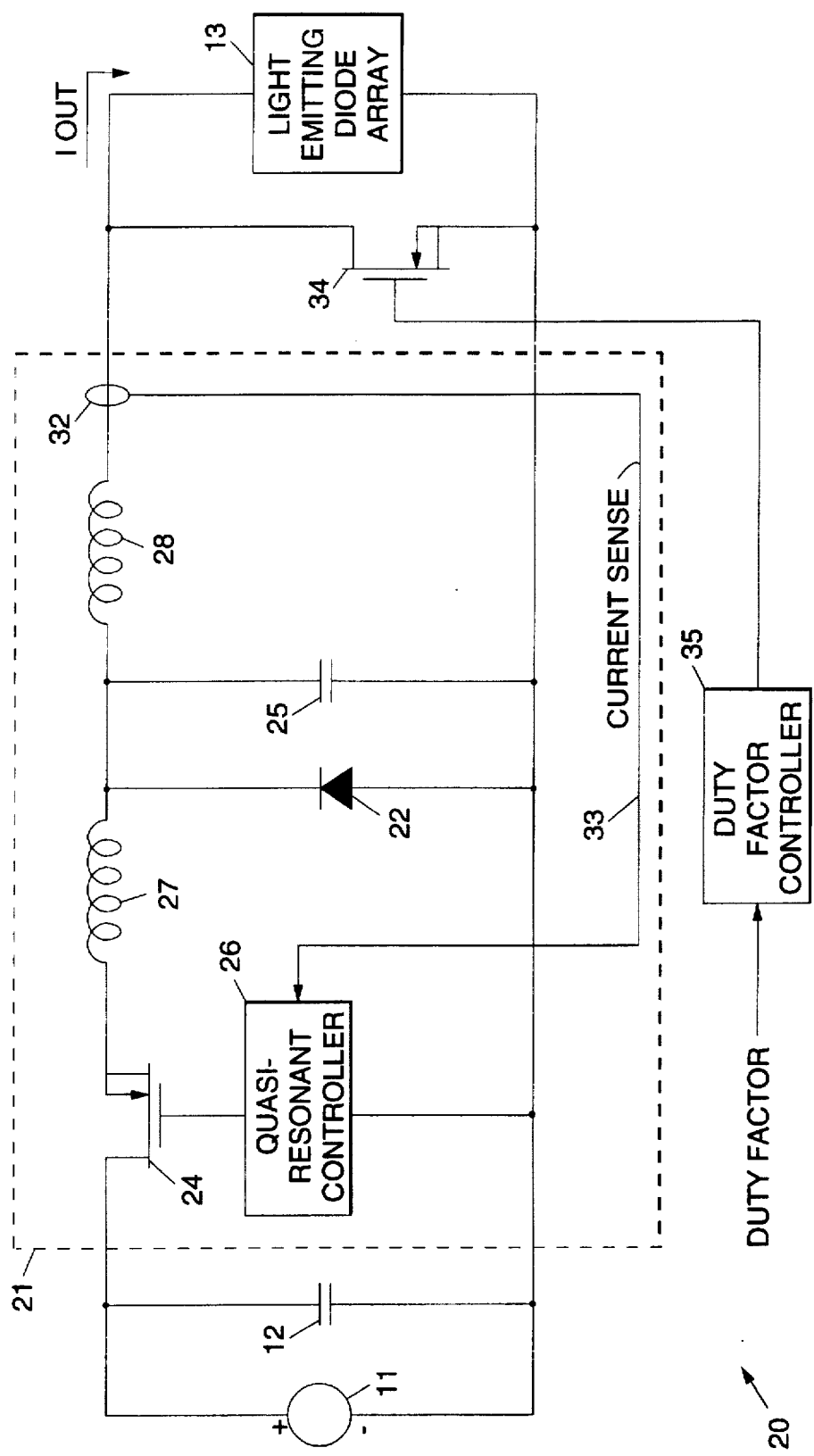
FIG. 2 shows a simplified schematic of a diode drive current source in accordance with the principles of the present invention.

FIG. 2 shows a simplified schematic of a first diode drive current source 20 in accordance with the principles of the present invention. The diode drive current source 20 comprises a constant current source 21 that provides output current to one load 13, such as the light emitting diode array 13. The diode drive current source 20 comprises a zero-current-switched full-wave quasi-resonant buck converter 21, a duty factor controller 35, and a shunt switch 34. However it is to be understood that the diode drive current source 20 of the present invention may be readily configured in accordance with other converter topologies. The quasi-resonant converter 21 makes use of component parasitics, or at a minimum, masks component parasitics, such that their effect is negligible.

The zero-current-switched quasi-resonant converter 21 is comprised of a switch transistor 24, a resonant inductor 27, a filter inductor 28, a resonant capacitor 25, a catch diode 22, an output current sensor 32, and a quasi-resonant controller 26 interconnected as shown. The current sensor 32 senses the output current flowing in the filter inductor 28 and is coupled by way of a sense line 33 to the quasi-resonant controller 26 that regulates the amount of average current flowing through the filter inductor 28, by varying the switching frequency. The quasi-resonant converter 21 provides regulated current to the output.

The resonant inductor 27 provides a high impedance for the switch transistor 24 during the switching time, and thus permits lossless switching of the switch transistor 24. The resonant capacitor 25 masks the capacitance and reverse recovery of the catch diode 22, and thus negates the switching losses of the catch diode 22. This configuration provides essentially lossless switching. Detailed circuit descriptions of resonant converters are available in the published literature, and may be found in "Linear Integrated Circuits Data and Applications Handbook," publication number IC600, published April 1990 by Unitrode Integrated Circuits Corporation, for example.

Figure 4:
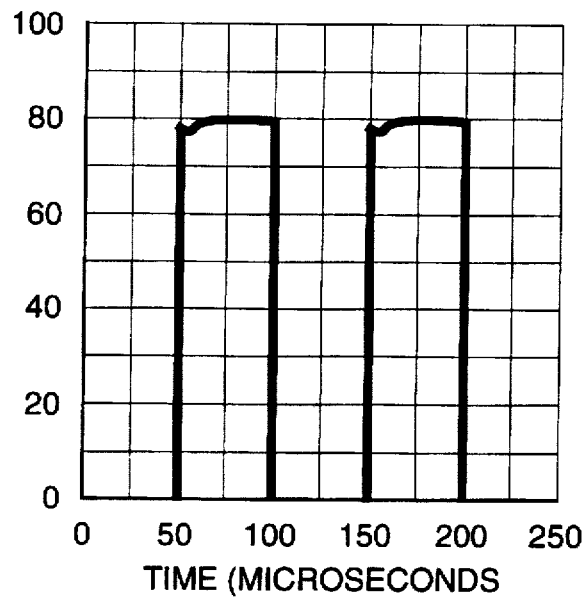
FIGS. 4 and 5 show waveforms derived from simulation results that illustrate the functions and advantages of the present invention.
Figure 5:
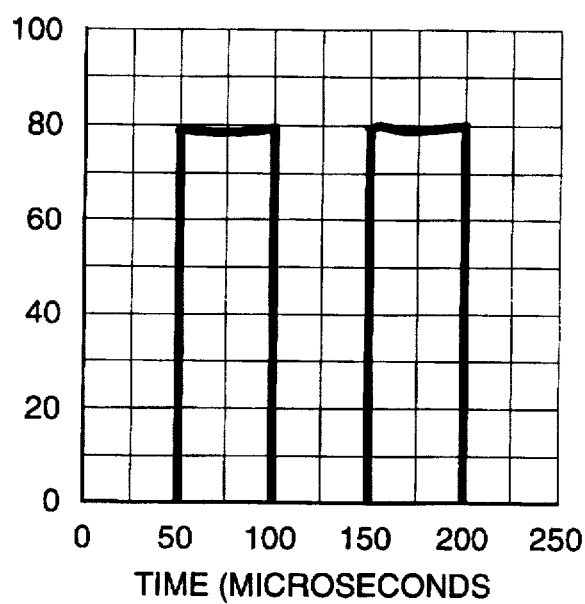

In accordance with the present invention, output power from the constant current source 21 is controlled by switching a shunt switch 34. The shunt switch 34 is switched using a duty factor controller 35 whose input signal comprises a duty factor that determines or sets the duty factor of the shunt switch 34. With the shunt switch 34 closed, no power is delivered to the load 13, and essentially no power is dissipated in the switch 34. With the shunt switch 34 open, regulated current is delivered to the load 13, and no power is dissipated in the switch 34. Thus, the efficiency of the diode drive current source 20 is very high, approaching 100%, and load current rise and fall times are very fast, typically less than 1 μsec. The rise and fall times of the load current are shown in FIGS. 4 and 5.

Figure 3:
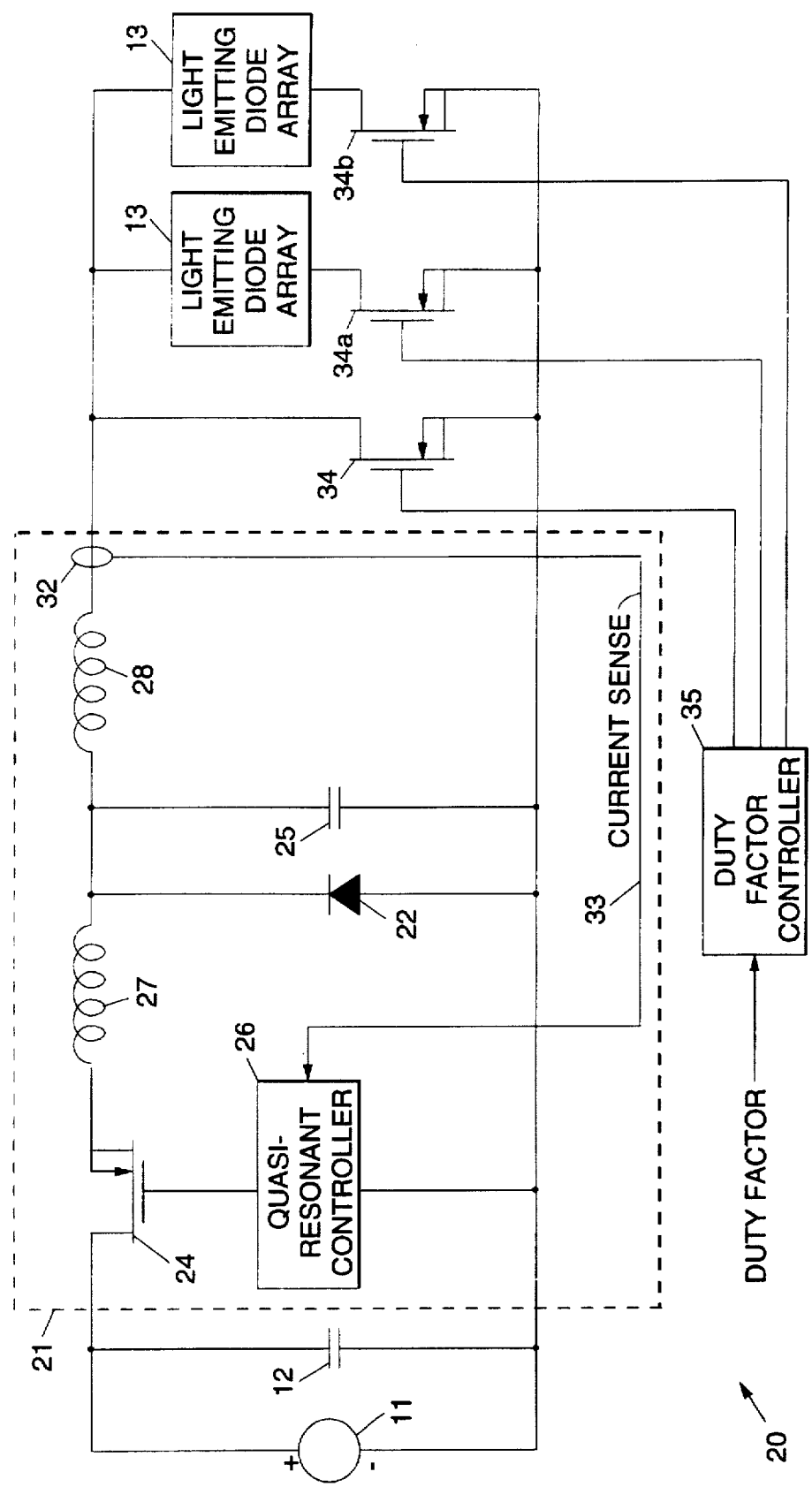
FIG. 3 shows a simplified schematic of a diode drive current source in accordance with the principles of the present invention that may be used to drive multiple loads.

FIG. 3 shows a simplified schematic of a second diode drive current source 20a in accordance with the principles of the present invention that may be used to drive multiple loads 13. This diode drive current source 20a includes the shunt switch 34 coupled across two loads 13 that may each comprise light emitting diode arrays 13. Each of the loads 13 are coupled through respective first and second series switches 34a, 34b to the negative output of the power source 11. Each of the first and second series switches 34a, 34b are controlled by the duty factor controller 35 in the manner described above with regard to the shunt switch 34.

In operation, with the shunt switch 34 closed, no power is delivered to the respective loads 13. If the first series switch 34a is closed and the shunt switch 34 opened, regulated current is delivered to a first load 13. If the second series switch 34b is closed and the first series switch 34a is opened, regulated current is delivered to a second load 13. If the shunt switch 34 is closed, no power is delivered to the either of the loads 13. If a DC output current through the filter inducer 28 is required, current sense transformers may be utilized in series with the switches 34, 34a, 34b. A DC current is then reconstructed by the summation of the individual currents.

A zero-current-switched full wave quasi-resonant buck converter has been described for use in with the present invention and which may be used as the constant current source 21. However, it is to be understood that the concepts of the present invention applies to other current source topologies as well. A detailed description of the quasi-resonant current source employed in the present invention and described herein is provided in U.S. Pat. No. 5,287,372, entitled "Quasi-Resonant Diode Drive Current Source", the contents of which are incorporated herein by reference.

The diode drive current source 20 has been simulated using spice-based computer analysis. FIGS. 4 and 5 show load current waveforms derived from simulation results that illustrate the functions and advantages of the present invention. The spice-based computer analysis was used to generate the waveforms of FIGS. 4 and 5. The simulation results illustrate the functions and advantages of the diode drive current source 20 of the present invention. Predicted efficiency is approximately 93%.

A prototype has been built and tested. Performance of the prototype closely matches the predicted performance illustrated in FIGS. 4 and 5. The efficiency of the prototype substantially matches the predicted efficiency of 93%.

Thus there has been described new and improved diode drive current sources, and specifically diode drive current sources for use with diode pumped lasers, and that are capable of driving a plurality of loads. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A current source for driving a load, the load including a plurality of laser diodes, the current source comprising:

a power source;

a constant current source coupled between the power source and the load for providing regulated current to the load;

a shunt switch coupled across the load;

a duty factor controller coupled to the shunt switch for providing a signal to the shunt switch that regulates the duty factor of the pulsed current supplied to the load; and wherein the constant current source comprises a buck converter comprising:

a switch transistor coupled in series with the power source;

a resonant inductor coupled in series with the switch transistor;

a filter inductor coupled in series with the resonant inductor;

a resonant capacitor and a catch diode coupled in parallel across the filter inductor and the load;

current sensing means for sensing the regulated current provided to the load; and control means coupled between the current sensing means and the switch transistor for regulating the current supplied to the load.

2. The current source of claim 1 wherein the control means comprises a quasi-resonant controller.

3. A current source for driving a load, the load including a plurality of laser diodes and a plurality of element arrays, the current source comprising:

a power source;

a constant current source coupled between the power source and the load for providing regulated current to the load;

a shunt switch coupled across the load;

a duty factor controller coupled to the shunt switch for providing a signal to the shunt switch that regulates the duty factor of the pulsed current supplied to the load; and first and second series switches respectively coupled between the power source and the plurality of element arrays, and wherein the first and second series switches are coupled to and are controlled by the duty factor controller.

4. The current source of claim 3 wherein the constant current source comprises a buck converter.

5. The current source of claim 3 wherein the plurality of loads comprise light emitting diode arrays.

6. A current source for driving a plurality of loads comprising:

a power source;

a constant current source coupled between the power source and the plurality of loads;

a shunt switch coupled across the plurality of loads;

a plurality of series switches respectively coupled in series with the plurality of loads; and a duty factor controller coupled to the shunt switch and to the plurality of series switches for providing signals to the shunt switch and to the plurality of series switches that regulate the respective duty factors of the pulsed current supplied to the plurality of loads, and wherein the summation of duty factors of the respective signals is less than or equal to 100%.

7. The current source of claim 6 wherein the plurality of loads comprise a plurality of light emitting diode arrays.

8. The current source of claim 6 wherein the constant current source comprises a buck converter.

9. A laser drive circuit for driving light emitting diode arrays, said circuit comprising:

a power source for providing power to the light emitting diode arrays;

charge storage means coupled to the power source for storing charge;

a plurality of light emitting diode arrays coupled to the charge storage means wherein each diode emitting array contains individual pluralities of light emitting diodes that operate at a predetermined low duty cycle; and a plurality of diode drive current sources respectively coupled to the plurality of light emitting diode arrays, wherein each diode drive current source comprises a shunt switch coupled across a respective light emitting diode array, and wherein a duty factor controller is coupled to the shunt switch for setting its duty factor.

10. The laser drive circuit of claim 9 wherein each diode drive current source comprises:

a constant current source coupled between the power source and a selected diode array for providing output current to the selected diode array.

11. The laser drive circuit of claim 10 wherein the constant current source comprises a buck converter.

12. The laser drive circuit of claim 11 wherein the buck converter comprises:

switching means coupled between the charge storage means and the selected diode array;

a resonant inductor and a filter inductor serially coupled between the switching means and the selected diode array; and a catch diode and a resonant capacitor coupled across the filter inductor and the selected diode array;

diode current sensing means for sensing current flowing through the selected diode array; and control means coupled to the diode current sensing means for regulating the current supplied to the selected diode array.

13. A current source for driving a load that comprises a plurality of laser diodes, said current source comprising:

a power source;

a constant current source coupled between the power source and the load for providing regulated current to the load;

a shunt switch coupled across the load;

a duty factor controller coupled to the shunt switch for providing a signal to the shunt switch that regulates the duty factor of the pulsed current supplied to the load; and first and second series switches respectively coupled in series with the plurality of laser diodes that comprise the load, and wherein the first and second series switches are coupled to and are controlled by the duty factor controller.

* * * * *